(12) United States Patent
Boguslavskiy et al.

(10) Patent No.: US 9,719,629 B2
(45) Date of Patent: Aug. 1, 2017

(54) SUPPORTING SYSTEM FOR A HEATING ELEMENT AND HEATING SYSTEM

(71) Applicants: PLANSEE SE, Reutte (AT); PLANSEE USA LLC, Franklin, MA (US)

(72) Inventors: Vadim Boguslavskiy, Princeton, NJ (US); Arno Plankensteiner, Absam (AT)

(73) Assignees: Plansee SE, Reutte (AT); Plansee USA LLC, Franklin, MA (US)

( * ) Notice: Subject to any disclaimer, the term of this patent is extended or adjusted under 35 U.S.C. 154(b) by 455 days.

(21) Appl. No.: 14/247,427

(22) Filed: Apr. 8, 2014

(65) Prior Publication Data

US 2015/0289319 A1    Oct. 8, 2015

(51) Int. Cl.
*F16M 13/02*    (2006.01)
*H05B 6/08*    (2006.01)
*H01L 21/67*    (2006.01)

(52) U.S. Cl.
CPC ....... *F16M 13/02* (2013.01); *H01L 21/67103* (2013.01); *H05B 6/08* (2013.01)

(58) Field of Classification Search
CPC .................................. H05B 3/06; H05B 6/08
See application file for complete search history.

(56) References Cited

U.S. PATENT DOCUMENTS

| | | | |
|---|---|---|---|
| 6,242,719 B1 | 6/2001 | Kano et al. | |
| 7,645,342 B2 | 1/2010 | Emerson | |
| 2006/0130763 A1* | 6/2006 | Emerson | C23C 16/46 118/725 |
| 2010/0275787 A1* | 11/2010 | Bonacci | A47J 31/3676 99/295 |

FOREIGN PATENT DOCUMENTS

EP    0964433 A2    12/1999

* cited by examiner

*Primary Examiner* — Brian Jennison
(74) *Attorney, Agent, or Firm* — Laurence A. Greenberg; Werner H. Stemer; Ralph E. Locher

(57) ABSTRACT

A supporting system for a heating element includes a supporting member and a base member. The supporting member has a main extension direction extending substantially in a height direction and a proximal and distal end. The proximal end is adapted to support the heating element. The base member is connected via at least one hinge to a distal portion of the supporting member which distal portion is arranged distal from the proximal end. The supporting member is pivotable relative to the base member about a rotation axis which is oriented parallel to a substantially rigid direction.

10 Claims, 4 Drawing Sheets

SUPPORTING SYSTEM FOR A HEATING ELEMENT AND HEATING SYSTEM

BACKGROUND OF THE INVENTION

Field of the Invention

The present invention relates to a supporting system for the support of a heating element and also to a heating system comprising at least one heating element.

Furnaces or electric heaters comprising resistive heating elements are commonly known and used in different industries for various applications. Heat is thereby generated when an electric current is applied through the electric conductive heating elements, also known as heating filaments, and due to electric resistance electric energy is dissipated into heat. Typically the heating elements are placed in close proximity to the item or material to be heated. Heater systems for various applications such as reactors for MOCVD (metal organic chemical vapor deposition) techniques used e.g. in the processing of semiconductor materials, e.g. for the epitaxial growth of compound semiconductors, are required to be operated at considerable elevated temperatures, e.g. above 800° C. which poses challenges in the design and on the material of the heating element assembly. For applications which require especially high temperatures the heating elements are frequently made from ceramic materials (which is expensive and difficult to manufacture into the desired geometric shape) or comprise refractory metals such as tungsten, molybdenum, rhenium, tantalum, niobium, etc. or alloys thereof.

When designing a high-temperature heating system one of the main issues one has to cope with is the thermally induced cyclic expansion and contraction of the heating elements. For certain applications, in particular for MOCVD reactors, a precise positioning of the heating elements is important, which should also be maintained in a controlled way during operation cycles of the heating system. Usually different kinds of mechanical support structures such as terminals are used to make sure that the heating elements are positioned correctly and kept in a predefined position. When e.g. during a MOCVD process inside of the reactor the heating elements are heated up to 1000 to 2200° C. the heating elements expand considerably and when kept in a fixed place by the terminal, significant mechanical stress is generated inside the material of the heating element. Such mechanical stress might lead to uncontrolled plastic deformations or cause the heating element to deteriorate or even break, leading to a decreased lifetime of the heating element. Uncontrolled deformations are undesired since there is a severe risk of a contact between the heating element with other parts of the heating systems or with other heating elements or within the heating element itself and as a consequence a short circuit might occur. Furthermore, since deformations of the heating elements influence the local electric resistivity plastic deformations are especially unfavorable in demanding high temperature applications like epitaxial growth processes of compound semiconductors where a homogeneous or otherwise precisely controlled temperature profile is important. The situation with heating elements comprising refractory metals is most problematic because the strength creep resistance of these metals decreases with temperature and drops substantially above 1200 to 1400° C. Above these temperatures even small stresses might cause undesired plastic deformations which are retained when the heating element cools down.

To overcome problems with fixed terminals various systems with flexible elements have been devised which are designed to allow expansion of the heating element in some preferable directions. Some such known terminals comprise different kinds of springs, e.g. with an U-form shape which allow a movement of the connection position between the heating element and the terminal. While such springs with an U-form shape achieve to reduce thermally induced stress inside the heating elements to a certain extent, their properties do not fully convince in practice since the heating element can extend itself in two or more directions and there remains a risk of a short circuit due to electric contact of the heating elements with itself or other parts of the heating system.

U.S. Pat. No. 7,645,342 B2 proposes that the heating elements include a plurality of extended pin openings through which pins are inserted to fix the heating elements in a plane. The size and geometric shape of the pin openings are designed such that within a certain temperature range they should allow the expansion of the heating element in the horizontal direction. However, in practical implementations several problems occur, especially at high temperatures above 1500° C. It is found that at such high temperatures the pins which are in contact with the heating element and usually are made of refractory metals have a tendency to bond via diffusion to the heating elements, thus hindering them from a free movement in a horizontal direction. As a consequence, mechanical stress is bunt up upon heating, leading to plastic deformations of the shape of the heating element.

According to the aforesaid, there is a need in the industry for supporting systems for heating elements, in particular for heating elements which can be used in high temperature heaters operating at temperatures above 1600°.

SUMMARY OF THE INVENTION

It is accordingly an object of the invention to provide a supporting system for a heating element and a heating system which overcome the above-mentioned disadvantages of the heretofore-known devices and methods of this general type and which provides for a supporting system for a heating element in a heater as well as a heating system with such supporting systems wherein thermally induced stress inside the heating element is reduced during operation and the heating element and the heating system are especially suitable for high-temperature applications.

With the foregoing and other objects in view there is provided, in accordance with the invention, a supporting system for supporting a heating element, the supporting system comprising:

a supporting member having a main extension direction extending substantially in a height direction, a proximal end configured to support the heating element, a distal portion distal from said proximal end, and a distal end;

a base member connected by way of at least one hinge to said distal portion of said supporting member, with said supporting member being pivotably supported relative to said base member about a rotation axis oriented parallel to a substantially rigid direction.

In other words, the supporting system according to the invention for support of a heating element comprises a supporting member which is adapted to support the heating element. The supporting member is preferably rigid and has an elongated shape, it has a main extension direction and extends substantially in a height direction. Preferably, the main extension direction is exactly parallel or angled ≤10° with regard to the height direction, however, the supporting member does not need to have a strictly straight configuration.

The height direction can be defined to be perpendicular to the extension plane of the heating element in the local region where it is mounted at the supporting member in the oriented position. Preferably the heating element has a curved main extension direction and is arranged in a planar configuration which defines the extension plane. In case that the arriving part of the heating element at the supporting member is of substantially straight configuration the height direction can be defined by the overall geometric structure of the heating element.

According to the present invention, the supporting member has two ends, a proximal end and a distal end. The proximal end faces towards the heating element and has a supporting portion for the support of the heating element. The distal end is arranged distal from the proximal end and has a distal portion to which a base member is connected via at least one hinge. Preferably, the supporting member and the base member are pivotally connected via exactly one hinge. The base member can be secured to a base e.g. to a base plate in the heating system or the heater housing comprising the heating element. According to the invention the supporting member and the base member form two arms which are hinged together such that the supporting member is pivotable relative to the base member about an axis which is oriented parallel to a substantially rigid direction. Thus, the supporting member is movable in a moveable direction wherein the moveable direction is defined by a direction which is substantially perpendicular to the height direction (the angle is preferably in the range of 75-105°). Movements of the supporting member are restricted in the substantially rigid direction which is perpendicular to the moveable direction and perpendicular to the height direction. Therefore, the hinge provides the heating element the possibility to move along the moveable direction during thermal extension while it substantially hinders the heating element to displace in the substantially rigid direction.

During the heating up process of the heating element the heating element tries to expand its dimensions and thermal induced stress causing irregular deformations would build up if a relative movement between the heating element and basis member where the supporting system is fastened to a base of the heating system is prohibited. With this inventive arrangement it can be achieved that the thermally induced displacement of the heating element is guided in a controlled way and is substantially reduced to only one single direction, in particular the moveable direction or the height direction, respectively. This leads to the possibility that thermally induced mechanical stress inside the material of the heating element and thus the risk of plastic deformations is decreased.

It is advantageous if the rotation axis of the supporting member does not coincide with the center of mass of the supporting member and the rotation axis is arranged such that due to gravity a rotational moment onto the supporting member results, causing a force on the heating element in the desired expansion direction. Preferably, the rotation axis is arranged spacedly from the center of mass of the supporting member along the height direction and/or the moveable direction. Furthermore, it is advantageous if the force exerted by the supporting system into the movable direction does not exceed the limiting creep stress of the heating element material at operational temperature.

According to an advantageous embodiment of the invention, the base member extends at least partially from the distal portion in the height direction towards the proximal end. In another advantageous embodiment the base member can be arranged horizontally. Preferably, the base member and the supporting member are aligned at room temperature when the heating element is in its unheated state. Furthermore, in a preferred embodiment the main extension direction of the supporting member and/or the base member is substantially parallel to the height direction. Thus, it is substantially perpendicular to the plane spaced by the heating element configuration. This way a heating system can be realized which on the one hand has a very compact construction with a comparably small height and on the other hand still can be operated at high temperatures, in particular at temperatures above 1600°. Due to the extended elongated shape of the supporting member a resulting significant temperature difference between the proximal and distal end of the supporting member can be achieved, especially when the supporting member is arranged in proximity to the bottom surface of the heating system, which typically is cooled by a liquid such as water.

Furthermore, in a preferred embodiment the base member and the hinge is protected from heat via a heat shield system which can be arranged between the heating elements and the base member. Thus, the base member and the hinge are at a considerably lower temperature at which the material is less stressed.

The supporting member does not need to be made of full material, in a preferred embodiment the supporting member comprises two or more bars or sheets which are arranged in a substantially parallel orientation and are pivotally connected to the base member at its distal portion. The bars or sheets are mechanically connected to each other, e.g. via separator elements (sleeves) which are disposed between the bars or sheets and fastened with screws or the like. This way a construction for the supporting member can be realized which on the one hand requires less material and on the other hand is sufficiently stiffened against undesirable twisting or bending.

The inventive supporting system can provide mechanical support of the heating element only or can be configured both for mechanical support and electric supply of the heating element with electrical power.

Furthermore, regarding material composition parts of the inventive supporting system, in particular the supporting member and/or the base member and/or the components of the hinge, can comprise at least 90% by weight of a refractory metal. In particular, the refractory metal is selected from tungsten, molybdenum, niobium, tantalum, rhenium, and alloys thereof. One example for the material is tungsten or an alloy of tungsten (at least 90% by weight of tungsten), for example vacuum metallized tungsten alloy which besides tungsten comprises a small amount of potassium silicate. A further example for the material is molybdenum or an alloy of molybdenum (at least 95% by weight molybdenum).

A supporting system which provides mechanical support only needs to be electrically isolated against the base where it is fixed respectively against the housing of the heating system. In particular, electrical isolation can be provided by alumina ($Al_2O_3$) or boron nitride (BN) or ceramic materials such a aluminum nitride (AlN) or silicon alumina nitride (SiAlON), etc. In order to prevent the decomposition or evaporation of ceramics the supporting system has to be configured such that the temperature at the interface towards the electrical insulating parts does not exceed temperatures around 1500-1600° C.

Those skilled in the art will appreciate that there are numerous methods how to connect the heating element to the supporting member. These methods include twisted wire, clamping, welding, screwing, boiling and the like. For a supporting system which in addition provides electrical contact, the method selected should ensure sufficient surface contact between the supporting member and the heating element in order to achieve proper electrical connection between the supporting member and the heating element.

The invention further includes a heating system comprising at least one heating element and at least one supporting system according to the present invention. The heating system in particular can be configured such that it can be used as a heater in a MOCVD reactor.

The inventive heating system can be characterized such that each heating element comprises two supporting systems which are configured for power supply to the heating element and which are located at both ends of the heating element. The power supply supporting systems are in particular also configured for mechanical support of the heating element. In addition, further supporting systems according to the present invention are possible, in particular only for mechanical support of the heating element which are located with respect to the two ends of the heating element between the two supporting systems for power supply.

According to the invention the respective moveable directions of the different supporting systems of a single heating element originate from a common central point whereas the central point in particular can be chosen to lie in the extension plane of the heating element. In other words, in order to adjust the different supporting systems of a single heating element a common central point preferable in the extension plane of the heating element is defined. From this central point each of the supporting systems is aligned such that its respective moveable direction is oriented from the central point radially outwards.

It is advantageous that as in most known common heating systems the heating element or an arrangement of a plurality of heating elements are arranged in a planar configuration. In particular for MOCVD reactors various examples thereof are described in the above-mentioned U.S. Pat. No. 7,645,342 B2, which is hereby incorporated by reference. In an advantageous embodiment the heating element has a substantially circular configuration which is interrupted at some point leading to a first and a second end of the heating element defining a small interruption between. At the first and second end the heating element is electrically connected to a power source. In a preferable embodiment the supporting systems providing electrical contact are realized as rigid, fixed connections. Preferably, the distance between the two ends of the heating element is as small as possible, of course they have to be spaced sufficiently apart so that during operation no electrical short circuit may occur. For this embodiment it is advantageous if the central point is in coincidence with or close to the geometric middle point between the two ends of the (interrupted) circular configuration of the heating element. Thus, the moveable directions of the supporting systems are oriented radially outwards from a point close to the two ends of the (substantially) circular heating element.

Furthermore, the inventive heating system can be characterized in that the rotation axis of the supporting member is not aligned with the center of mass of the supporting member and a resulting rotational moment onto the supporting member causes a force on the heating element in direction of the desired expansion of the heating element, i.e. along an arc in the moveable direction of the supporting member. If the present invention is used for a heating system with a substantially circular extension it is advantageous that the supporting system provides a small force in the outward, namely in a—from the central point—radial direction. In order to avoid plastic deformation of the heating element it is preferable that the force exerted by the supporting system does not exceed the limiting creep stress of the heating element material, also at operational temperature when the material properties of the heating element deteriorate.

In an advantageous embodiment the heating system includes a heat shield system comprising one or a plurality of heat shields which are arranged below the heating elements. In a preferable embodiment the supporting member extends through openings in the heat shield system. The base member and the hinge in contrary are arranged below the heat shield arrangement and therefore will be protected from radiant (radiative) heat.

Other features which are considered as characteristic for the invention are set forth in the appended claims. The embodiments of the invention presented herein can be combined freely with each other. Many of the embodiments can be combined in order to form a new embodiment.

Although the invention is illustrated and described herein as embodied in a supporting system for a heating element and a heating system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
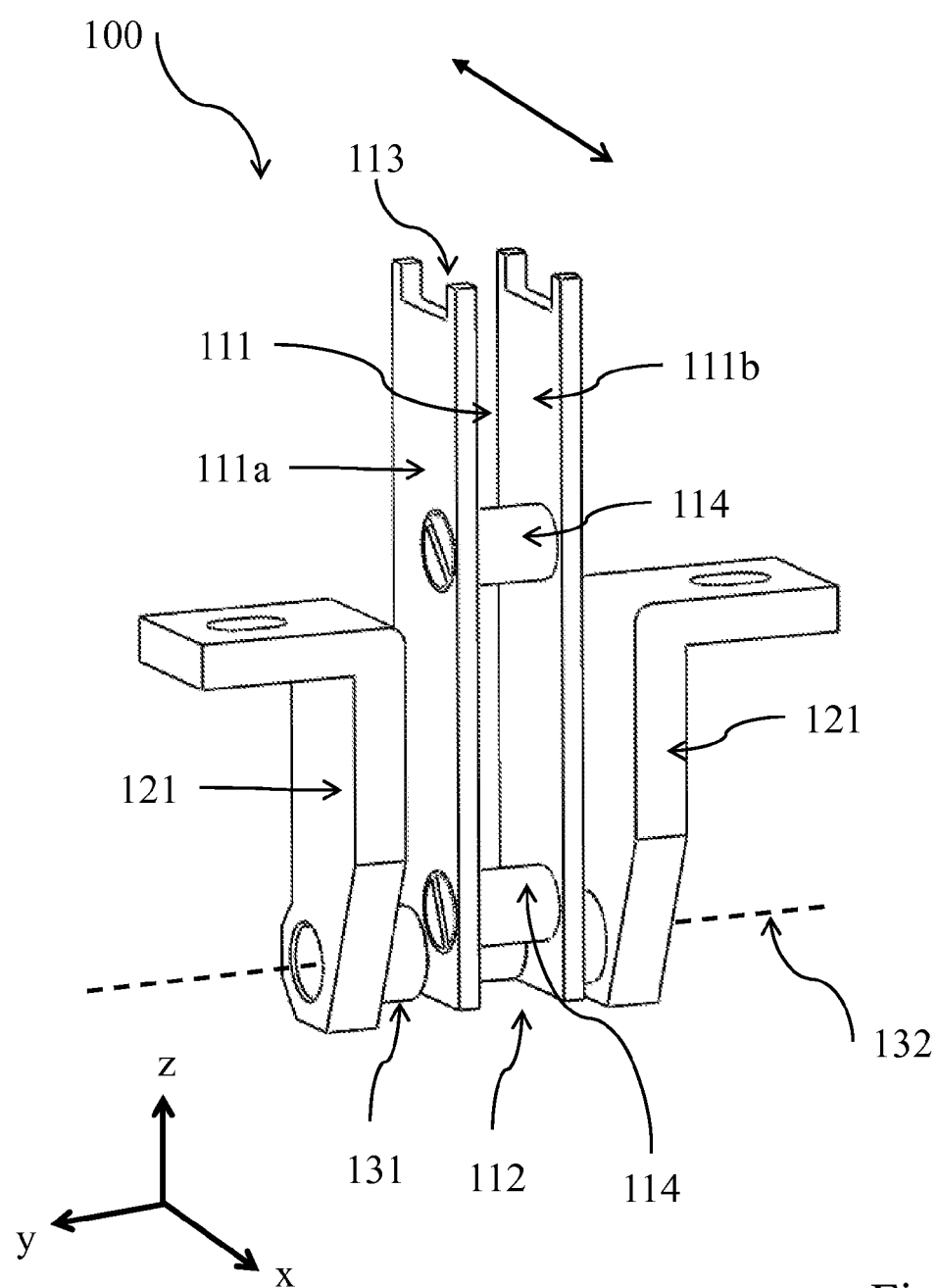
FIG. 1 a perspective view of a supporting system according to the present invention.

Referring now to the figures of the drawing in detail and first, particularly, to FIG. 1 thereof, there is shown a supporting system (100) formed with an elongated rigid supporting member (111) with a distal end (112) and a proximal end (113). On top of the rigid supporting member (111) there is mounted a non-illustrated heating element the extension of which defines an extension plane. The main extension of the supporting member (111) extends in a height direction z which is perpendicular to the extension plane of the heating element. The supporting system further comprises a base member (121) which is e.g. fixed on a support plate (not shown) with screws or any other kind of mechanical fixation. The supporting member (111) and the base member (121) are pivotally connected via a hinge (131) which in this specific embodiment is realized with a bolt, protruding pin or the like whose rotation axis (132) is oriented in a substantially rigid direction y orthogonal to the height direction z and the movable direction x. In order to provide for low friction the hinge can be made of a hard ceramic material like Alumina ($Al_2O_3$) or sapphire which at the same time provides electric insulation.

The rotation axis (132) is arranged spacedly with the center of mass of the supporting member (in this specific embodiment the rotation axis is arranged in a distal portion dose to the distal end of the supporting member) and is positioned asymmetric with respect to the main extension direction of the supporting member (111) such that due to the weight of the supporting member a rotational moment onto the supporting member will arise. This causes a force on the heating element in direction of the desired outward expansion of the heating element.

Figure 4:
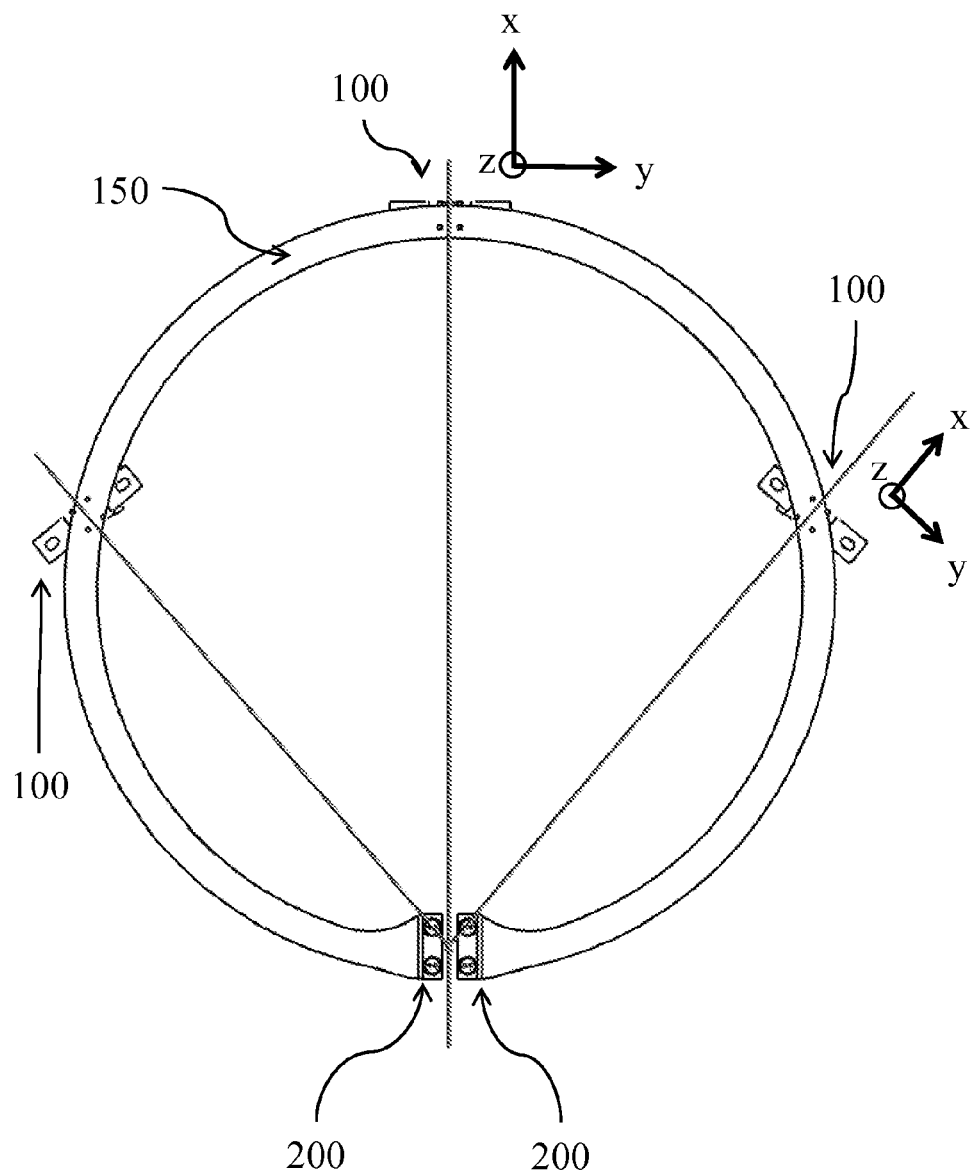
FIG. 4 a top view of the heating system illustrated in FIG. 3.

In this embodiment the supporting member is realized with two bars (111a, 111b) which are arranged in a substantially parallel orientation and are hinged to the base member at its distal portion. The bars are mechanically attached to each other via sleeves (114) disposed between the bars and fixed with screws or the like. Preferably the sleeves are arranged asymmetric with respect to the main extension direction of the supporting member (111) in an opposite direction to the rotation axis (132) such that the additional weight of the sleeves leads to a rotational moment in the desired expansion direction. This construction substantially hinders the heating element to displace in the rigid direction y. During the heating process the dimension of the heating element increases and when arranged in a circular configuration—a top view of this situation is shown in FIG. 4—the heating element tends to move radially outward. In order to reduce thermally induced stress inside the heating element, the supporting system (100) according to the present invention provides the heating element the possibility to move relative to the base member (121) during thermal extension. The proximal end of supporting member (111) is dislocated as to the base member (121) by a movement along an arc in the moveable direction x.

While the supporting member (111) in this specific embodiment is realized as an extended linear object, in general the supporting member (111) does not have to be of straight configuration nor has to be arranged parallel to the height direction z. However, it has to be ensured that the heating element can move freely in a moveable direction x.

The arrangement of the base member, which in this specific embodiment extends at least partially in the height direction towards the proximal end of the supporting member, enables an extremely compact construction of the supporting system so that compared to known conventional designs considerable less height is required between the heating element and the bottom surface of the heating system.

Figure 2:
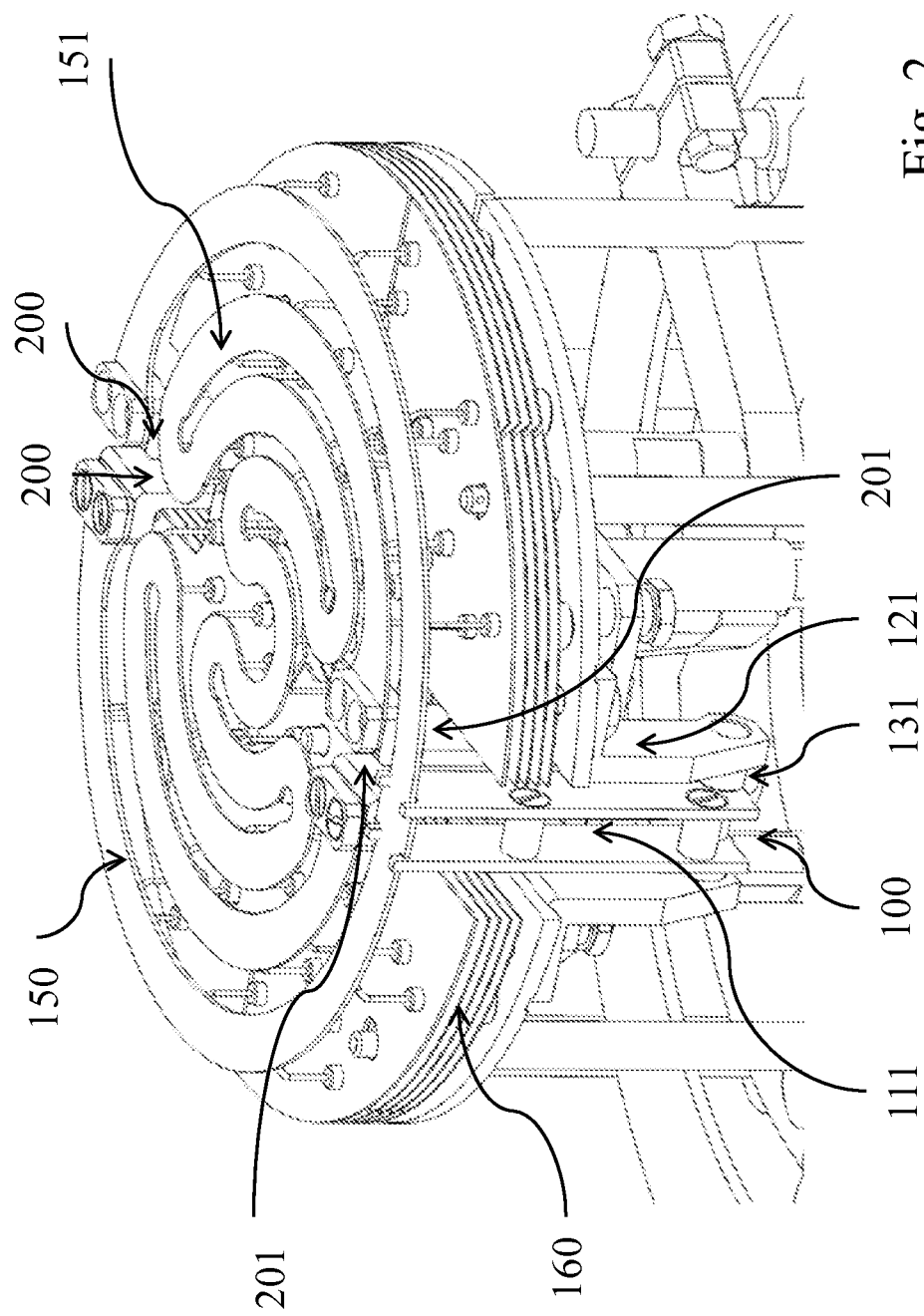
FIG. 2 a perspective view of a first embodiment of a heating system according to the present invention.

FIG. 2 illustrates an exemplary heating system according to the present invention comprising two heating elements (150, 151) which are individually controllable such that a better control of the temperature profile of the heating system is gained. The heating elements (150, 151) each are mounted on two fixed, rigid supporting systems (200, 201) at their ends respectively. These fixed supporting systems (200, 201) at the heating elements ends are configured for the supply of the heating elements with electric power. The outer heating element (150) with an interrupted circular configuration is in addition mechanically supported by a flexible supporting system (100) according to FIG. 1 comprising a supporting member (111) and a base member (121) connected via a hinge (131). The supporting system (100) is configured for mechanical support only and needs to be electrically isolated against the base at which it is mounted, e.g. if the hinge is made of an electric isolating material.

It is advantageous if a heat shield system (160) comprising one or stacked layers of heat shields is installed. The heat shields are placed in dose proximity to one another with a 1-5 mm separation being typical. They are maintained by spacer elements in the desired position. The supporting member of the mechanical supporting system (100) as well as the fixed, rigid supporting systems (200, 201) for power supply extend through openings in the heat shields.

Figure 3:
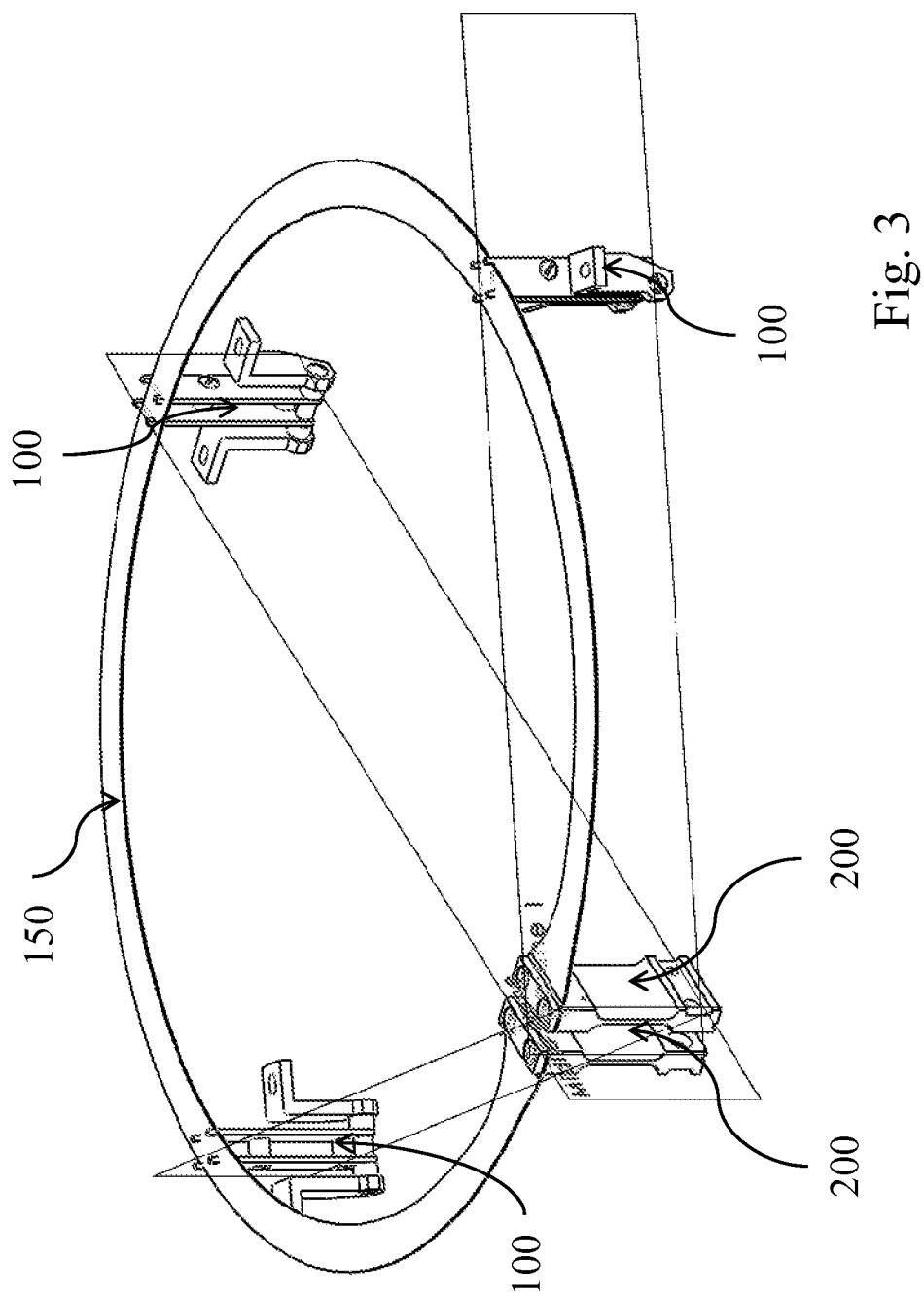
FIG. 3 a perspective view of a second embodiment of an inventive heating system.

FIG. 3 depicts another embodiment of an exemplary heating system comprising a heating element (150) with an interrupted circular configuration mounted on two fixed, rigid supporting systems (200) at its end respectively. These fixed supporting systems (200) at the heating element ends provide the heating element with electric power. The distance between the ends of the filament is kept as small as possible without causing electric short during operation of the heating system. Several flexible supporting systems (100) comprising a hinge are provided for mechanical support of the heating element which are electrically isolated against the base at which they are mounted. For reasons of clarity a heat shield system is not shown in FIG. 3.

FIG. 4 shows a top view of the heating system in FIG. 3 and illustrates the orientation of the moveable direction x of the supporting systems (100). In this embodiment the respective moveable directions of the different supporting systems (100) originate from the geometric middle point between the two ends of the (interrupted) circular configuration of the heating element and are oriented in the extension plane of the heating element radially outwards.

It should be readily understood that the invention is not limited to these specific embodiments, for heating systems certainly different embodiments of the supporting system can be employed and other combinations of support systems are possible. In particular the electricity supplying supporting systems (200) can be realized by a flexible supporting system comprising a hinge.

The invention claimed is:

1. A supporting system for supporting a heating element, the supporting system comprising:
a supporting member having a main extension direction extending substantially in a height direction, a proximal end configured to support the heating element, a distal portion distal from said proximal end, and a distal end, said supporting member having two bars arranged in a substantially parallel orientation, said bars being mechanically connected by connectors disposed therebetween;
a base member connected by way of at least one hinge to said distal portion of said supporting member, with said supporting member being pivotably supported relative to said base member about a rotation axis, said rotation axis being disposed at a spacing distance from a center of mass of said supporting member and said connectors being arranged asymmetrically with respect to the main extension direction of said supporting member on an opposite side to said rotation axis for providing a rotational moment of said supporting member in a desired expansion direction of the heater.

2. A heating system, comprising:
at least one heating element;
a supporting system for supporting said at least one heating element, the supporting system including:
a supporting member having a main extension direction extending substantially in a height direction, a proximal end supporting said at least one heating element, a distal portion distal from said proximal end, and a distal end;

a base member connected by way of at least one hinge to said distal portion of said supporting member, said supporting member being pivotably supported relative to said base member about a rotation axis for moving said proximal end with said heating element in a movement direction during an outward thermal expansion of said heating element.

3. The heating system according to claim 2, wherein said at least one heating element has a circular configuration with two ends and a geometric middle point between said two ends, the geometric middle point defines a common central point, said at least one supporting system is one of a plurality of supporting systems each oriented such that respective movement directions of each of said plurality supporting systems are defined by rays that originate from the common central point.

4. The heating system according to claim 2, which further comprises a heat shield system disposed below said heating element and above said hinge and said base member, and wherein said heat shield system is formed with openings through which said supporting member of said supporting systems extend.

5. The heating system according to claim 2, wherein said rotation axis is disposed at a spacing distance from a center of mass of said supporting member.

6. The heating system according to claim 5, wherein said rotation axis is spaced from the center of mass of said supporting member along a height direction and/or said movement direction.

7. The heating system according to claim 2, wherein said base member extends at least partially from said distal portion in a height direction towards said proximal end.

8. The heating system according to claim 2, wherein said supporting member comprises two or more bars arranged in a substantially parallel orientation.

9. The heating system according to claim 2, wherein a material of one or both of said supporting member or said base member comprises at least 90% by weight of a refractory metal.

10. The heating system according to claim 9, wherein said refractory metal is selected from the group consisting of tungsten, molybdenum, tantalum, rhenium, niobium, and alloys thereof.

* * * * *